US012655017B2

(12) United States Patent
Saugier

(10) Patent No.: US 12,655,017 B2
(45) Date of Patent: Jun. 16, 2026

(54) WAFER LEVEL PROXIMITY SENSOR AND METHOD OF MAKING SAME

(71) Applicant: STMicroelectronics International N.V., Geneva (CH)

(72) Inventor: Eric Saugier, Froges (FR)

(73) Assignee: STMicroelectronics International N.V., Geneva (CH)

( * ) Notice: Subject to any disclaimer, the term of this patent is extended or adjusted under 35 U.S.C. 154(b) by 296 days.

(21) Appl. No.: 18/215,322

(22) Filed: Jun. 28, 2023

(65) Prior Publication Data

US 2025/0002333 A1     Jan. 2, 2025

(51) Int. Cl.
B81C 1/00          (2006.01)
B81B 7/02          (2006.01)

(52) U.S. Cl.
CPC .......... B81C 1/00063 (2013.01); B81B 7/02 (2013.01); *B81B 2201/0292* (2013.01); *B81B 2207/096* (2013.01); *B81C 2203/03* (2013.01); *B81C 2203/054* (2013.01)

(58) Field of Classification Search
CPC .......... B81C 1/00063; B81C 2203/03; B81C 2203/054; B81C 1/00317; B81B 7/02; B81B 2201/0292; B81B 2207/096; H01L 21/76877; H01L 21/304; H01L 23/488; H01L 23/5226; H01L 25/167; G01S 17/04; G01S 17/08
See application file for complete search history.

(56) References Cited

U.S. PATENT DOCUMENTS

| | | | |
|---|---|---|---|
| 8,836,924 B2 * | 9/2014 | Popp ..................... | G01S 17/894 |
| | | | 356/3.01 |
| 10,608,035 B2 | 3/2020 | Lin et al. | |
| 11,846,731 B2 * | 12/2023 | Matsumoto .......... | G01S 7/4865 |
| 12,140,699 B2 * | 11/2024 | Etschmaier .......... | H10F 77/407 |
| 12,176,220 B2 * | 12/2024 | Luan .................... | H01S 5/02345 |
| 12,405,355 B2 * | 9/2025 | Kume .................... | H10F 71/00 |
| 2013/0187031 A1 * | 7/2013 | Popp ..................... | G01S 17/894 |
| | | | 438/57 |
| 2014/0071431 A1 | 3/2014 | Last | |
| 2017/0287886 A1 | 10/2017 | Gani | |

(Continued)

FOREIGN PATENT DOCUMENTS

| | | |
|---|---|---|
| CN | 114300932 A | 4/2022 |
| CN | 217181238 U | 8/2022 |

*Primary Examiner* — Lawrence Averick
(74) *Attorney, Agent, or Firm* — Crowe & Dunlevy LLC

(57) ABSTRACT

Wafer level proximity sensors are formed by processing a silicon substrate wafer and a silicon cap wafer separately, bonding the cap wafer to the substrate wafer to form a bonded wafer sandwich, and then selectively thinning the silicon substrate wafer and silicon cap wafer. The silicon substrate wafer is thinned first, and an interconnect structure of through-silicon vias is formed within the thinned silicon substrate wafer. The silicon cap wafer is then thinned to expose openings facing an area of the thinned silicon substrate wafer where a photosensitive region is location and facing an area of the thinned silicon substrate wafer where an emitter die is to be installed. After emitter die installation, the openings in the thinned silicon cap wafer are filled with a transparent material. The thinned silicon cap wafer further includes an opaque light barrier to block light transmission between the openings.

12 Claims, 8 Drawing Sheets

(56)         References Cited

U.S. PATENT DOCUMENTS

| | | | |
|---|---|---|---|
| 2020/0333442 A1 | 10/2020 | Etschmaier et al. | |
| 2021/0033710 A1* | 2/2021 | Matsumoto | H04N 23/55 |
| 2021/0373132 A1* | 12/2021 | Etschmaier | H10F 55/255 |
| 2022/0137398 A1* | 5/2022 | Seto | G01S 7/4817 |
| | | | 356/4.01 |
| 2022/0155417 A1* | 5/2022 | Kume | G02B 5/1857 |
| 2022/0189788 A1* | 6/2022 | Luan | H01S 5/02218 |
| 2025/0079189 A1* | 3/2025 | Luan | H01L 21/4803 |
| 2025/0176289 A1* | 5/2025 | Kimura | G03B 15/05 |

* cited by examiner

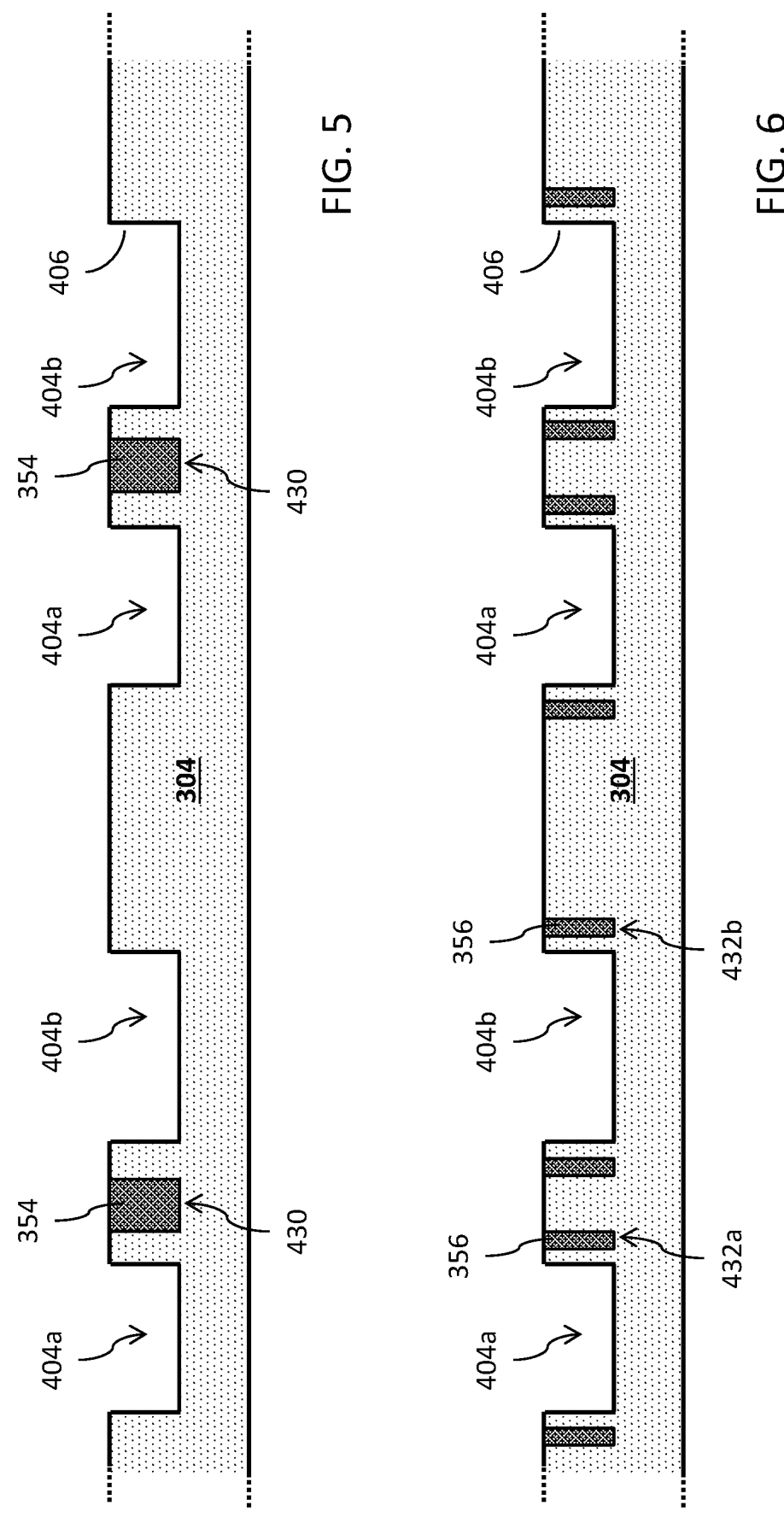

WAFER LEVEL PROXIMITY SENSOR AND METHOD OF MAKING SAME

TECHNICAL FIELD

The present disclosure generally relates to sensor technology and, in particular to a wafer level proximity (such as, for example, a Time of Flight (ToF)) sensor.

BACKGROUND

Electronic sensor technology is currently being incorporated into many consumer products, including automobiles, appliances, and mobile devices such as smart phones. Electronic micro-sensor devices can be used to detect environmental conditions such as temperature, humidity, rainfall, sounds, and the like. Such devices can also be used to detect modes of operation of consumer appliances in which they are installed, such as the orientation of a smart phone, use of voice commands, ambient light, and the like. Micro-sensors offer many advantages due to their size, reliability, and low cost. As electronic micro-sensors become smaller and less expensive, they are in higher demand.

One example of an electronic micro-sensor is a proximity sensor that detects the presence of nearby objects without a need for physical contact. Some proximity sensors emit a light beam that is reflected from a target object. The reflected light beam is then captured by the proximity sensor and compared with the emitted beam or with an ambient light level to detect changes that can yield information about the target object. One specific implementation of such a sensor is known to those skilled in the art as a Time of Flight (ToF) sensor that measures a time difference between emission of the light beam and return of the light beam reflected by the target to calculate a distance to the target.

Reference is now made to FIG. 1 which shows a cross-sectional view of a conventional ToF proximity micro-sensor module 100. The module 100 is housed inside a chip package 102 that is mounted on a substrate 104. The substrate 104 may, for example, comprise a printed circuit board including front connection pads 106, rear connection pads 108 and an electrical connection network 110 (with lines and vias) for electrically connecting the front and rear connection pads. A sensor integrated circuit die 112 is mounted to the front surface of the substrate 104 and electrically connected to the front connection pads 106 by bonding wires. An emitter integrated circuit die 114 is mounted to the front surface of the substrate 104 and electrically connected to the front connection pads 106 by bonding wires. The sensor integrated circuit die 112 includes a first photosensitive region 116 and a second photosensitive region 118. The emitter integrated circuit die 114 includes a photoemission region 120. A cap 124 is mounted to the substrate 104. The cap 124 is made of an opaque material and includes a peripheral side wall and a front wall. Distal ends of the peripheral side wall are mounted to the substrate 104 using a suitable adhesive. Openings are provided in the front wall generally vertically aligned with the locations of the first photosensitive region 116 for the sensor integrated circuit die 112 and the photoemission region 120 of the emitter integrated circuit die 114. An interior wall of the cap is positioned between the first photosensitive region 116 and the second photosensitive region 118. Each of the openings in the front wall of the cap 124 is filled with a transparent optical element 128 (such as, for example, including a lens and perhaps a filter).

In operation, light is emitted from the photoemission region 120 of the emitter integrated circuit die 114. This light is internally reflected within the cap 124—while being blocked by the internal wall from reaching the first photosensitive region 116—and detected by the second photosensitive region 118. The light further propagates through the transparent optical element 128a to outside of the micro-sensor module 100 to illuminate a target object. Light reflected by the target object returns to the micro-sensor module 100, passes through the transparent optical element 128b, and is detected by the first photosensitive region 116. The sensor integrated circuit die 112 measures the difference in time between sensing of the internally reflected light by second photosensitive region 118 and the sensing by the first photosensitive region 116 of the returned light reflected by the target object, and then calculates the distance from micro-sensor module 100 to the target object as a function of the measured difference in time.

Reference is now made to FIG. 2 which shows a cross-sectional view of a conventional wafer level ToF proximity micro-sensor module 200 (see, for example, United States Patent Publication No. 2017/0287886, incorporated herein by reference). The wafer level proximity micro-sensor module 200 is fabricated as an integrated sensor package. First, a silicon integrated circuit substrate wafer 202 and a silicon cap wafer 204 are processed separately. The separate wafers 202, 204 are then bonded to form a bonded wafer sandwich. Upper and lower surfaces of the bonded wafer sandwich are then processed further, and finally, the bonded wafer sandwich is singulated (or diced) by a cutting operation into the individual proximity micro-sensor modules 200.

The module 200 includes a sensor integrated circuit die 212 formed from the silicon integrated circuit substrate wafer 202. The sensor integrated circuit die 212 includes a first photosensitive region 216 and a second photosensitive region 218. Through silicon vias 213 form an electrical connection network 210 for electrically connecting front connection pads 206 of the sensor integrated circuit die 212 to a redistribution layer on the back side of the sensor integrated circuit die 212 which includes rear connection pads 208. An emitter integrated circuit die 214 is mounted to the front surface of the sensor integrated circuit die 212 and electrically connected to the front connection pads 206. The module 200 further includes a silicon cap 224 mounted to the sensor integrated circuit die 212. Openings are provided in the silicon cap 224 generally vertically aligned with the locations of the first photosensitive region 216 for the sensor integrated circuit die 212 and the photoemission region 220 of the emitter integrated circuit die 214. Each of the openings is filled with a transparent material (such as, for example, a transparent epoxy) forming a transparent optical element 228.

In operation, light is emitted from the photoemission region 220 of the emitter integrated circuit die 214. A portion of this light is internally reflected within the transparent optical element 228a and detected by the second photosensitive region 218. A further portion of the light propagates through the transparent optical element 228a to outside of the micro-sensor module 200 to illuminate a target object. Light reflected by the target object returns to the micro-sensor module 200, passes through the transparent optical element 228b, and is detected by the first photosensitive region 216. The sensor integrated circuit die 212 measures the difference in time between sensing of the internally refracted light by second photosensitive region 218 and the sensing by the first photosensitive region 216 of the returned light reflected by the target object, and then calculates the distance from micro-sensor module 200 to the target object as a function of the measured difference in time.

The wafer level proximity micro-sensor module 200 has many advantages over the conventional proximity micro-sensor module 100. For example, the wafer level proximity micro-sensor module 200 is smaller and less expensive to manufacture than the conventional proximity micro-sensor module 100. There are, however, concerns with addressing light propagation, providing improved light isolation relative to cross-talk between the photosensitive regions and improving the method of manufacture of the wafer level proximity micro-sensor module.

SUMMARY

In an embodiment, a method comprises: at each of a plurality of integrated circuit areas for a silicon integrated circuit substrate wafer, forming at least one photosensitive region and at least one front connection pad; forming a plurality of first trenches and a plurality of second trenches in a silicon cap wafer; providing an opaque light barrier at the silicon cap wafer to block light transmission through the silicon cap wafer between the first and second trenches; wafer-to-wafer bonding of the silicon cap wafer to the silicon integrated circuit substrate wafer to form a bonded wafer sandwich, where an opening of each first trench in the silicon cap wafer faces a corresponding photosensitive region of the silicon integrated circuit substrate wafer and wherein an opening of each second trench in the silicon cap wafer faces a corresponding front connection pad of the silicon integrated circuit substrate wafer; then, performing a back grind to thin the silicon integrated circuit substrate wafer of the bonded wafer sandwich; forming through silicon vias in the thinned silicon integrated circuit substrate wafer, wherein at least some of the through silicon vias are electrically connected to said at least one photosensitive region in each of the plurality of integrated circuit areas; then, performing a back grind to thin the silicon cap wafer and expose the openings of the first and second trenches; installing a light emitter integrated circuit die in the opening for each second trench mounted to the thinned silicon integrated circuit substrate wafer and electrically connected to said at least one front connection pad; filling the openings of the first and second trenches with a transparent material; and cutting through the bonded wafer sandwich between adjacent integrated circuit areas in a singulation operation to produce a plurality of individual wafer level micro-sensor modules.

In an embodiment, a device comprises: an integrated circuit substrate including at least one photosensitive region and at least one front connection pad; a silicon cap wafer-bonded to the integrated circuit substrate, said silicon cap including a first opening extending through a thickness of the silicon cap at said at least one photosensitive region and further including a second opening extending through the thickness of the silicon cap at an area where said at least one front connection pad is located; wherein said silicon cap further includes an opaque light barrier to block light transmission through the silicon cap wafer between the first and second openings; a light emitter integrated circuit die mounted to the integrated circuit substrate at said area in the second opening and electrically connected to said at least one front connection pad; and a transparent material fill in each of the first and second openings.

BRIEF DESCRIPTION OF THE DRAWINGS

For a better understanding of the embodiments, reference will now be made by way of example only to the accompanying figures in which:

FIGS. 5 and 6 each show a process step as a replacement for the process step of FIG. 4C in connection with manufacturing the micro-sensor module 300 shown in FIGS. 3B and 3C, respectively.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Reference throughout the specification to forming layers may entail the use of conventional thin film deposition techniques for depositing insulating and/or conductive and/or semiconductive materials, including such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating.

Reference throughout the specification to conventional photolithography techniques, known in the art of semiconductor fabrication for patterning various thin films, may include a spin-expose-develop process sequence typically followed by an etch process. Alternatively or additionally, photoresist can also be used to pattern a hard mask, e.g., a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Figure 1:
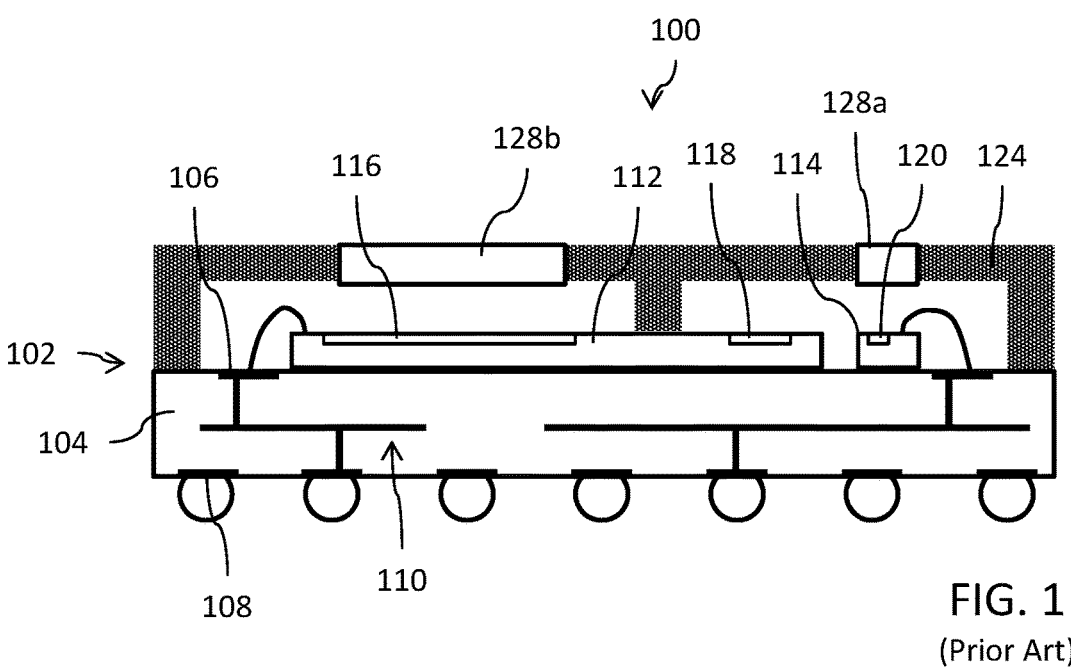
FIG. 1 is a cross-sectional view of a conventional time of flight (ToF) proximity micro-sensor module.
Figure 2:
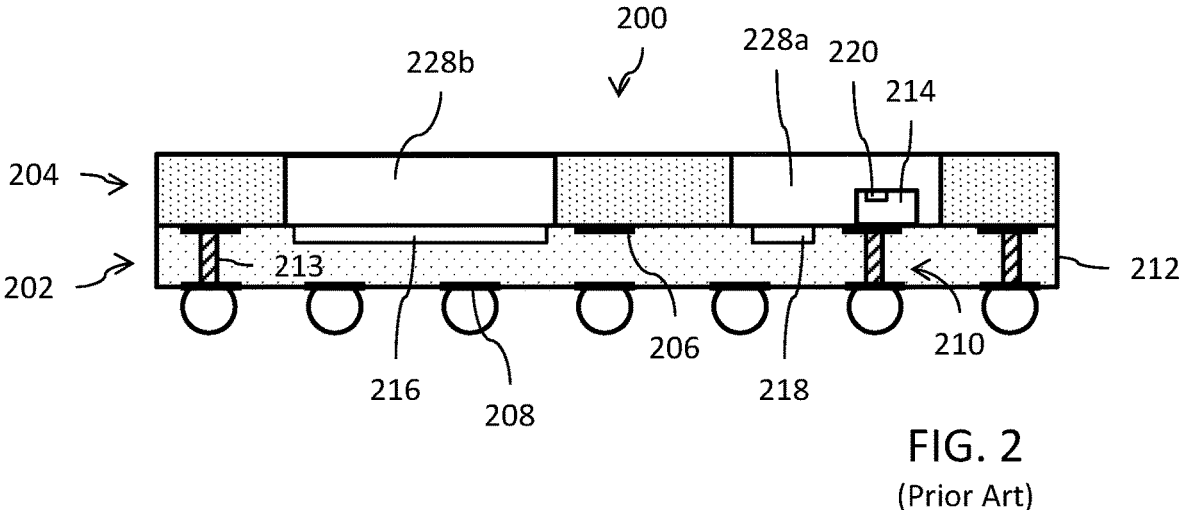
FIG. 2 is a cross-sectional view of a conventional wafer level ToF proximity micro-sensor module.
Figure 3A:
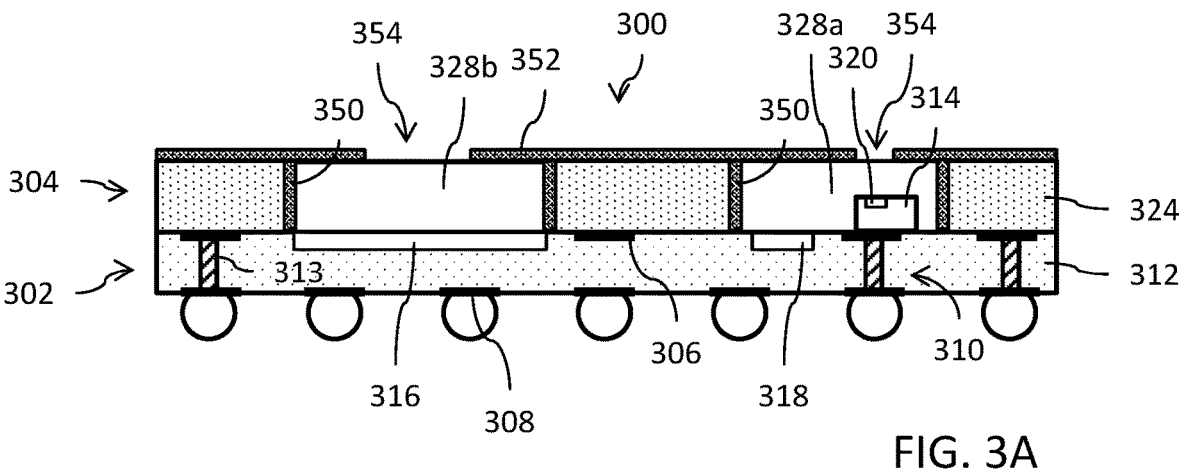
FIGS. 3A-3C are cross-sectional views of a wafer level ToF proximity micro-sensor module.

Reference is now made to FIG. 3A which shows a cross-sectional view of a wafer level ToF proximity micro-sensor module 300. The wafer level proximity micro-sensor module 300 is fabricated as an integrated sensor package. Details of the wafer level manufacturing process are provided below and illustrated in FIGS. 4A-4K. Briefly, a silicon integrated circuit substrate wafer 302 and a silicon cap wafer 304 are processed separately. The separate wafers 302, 304 are then bonded to form a bonded wafer sandwich. Upper and lower surfaces of the bonded wafer sandwich are then processed further, and finally, the bonded wafer sandwich is singulated into the individual proximity micro-sensor modules 300.

The module 300 includes a sensor integrated circuit die 312 formed from the silicon integrated circuit substrate wafer 302. The sensor integrated circuit die 312 includes a first photosensitive region 316 and a second photosensitive region 318. Through silicon vias 313 form an electrical connection network 310 for electrically connecting front connection pads 306 of the sensor integrated circuit die 312 to a redistribution layer on the back side of the sensor integrated circuit die 312 which includes rear connection pads 308. An emitter integrated circuit die 314 is mounted to the front surface of the sensor integrated circuit die 312 and electrically connected to the front connection pads 306. The module 300 further includes a silicon cap 324 mounted to the sensor integrated circuit die 312. Openings are provided in the silicon cap 324 generally vertically aligned with the locations of the first photosensitive region 316 for the sensor integrated circuit die 312 and the photoemission region 320 of the emitter integrated circuit die 314. Sidewalls of the openings are lined with a layer 350 of opaque material (for example, a black oxide, a metal or other suitable material for blocking infrared light) to address issues with light cross-talk between the photosensitive regions. The layer 350 may be molded within the openings or deposited using a conformal deposition or plating process. Each of the openings is filled with a transparent material (such as, for example, a transparent epoxy) forming a transparent optical element 328.

The module 300 may further include a patterned layer 352 of opaque material (for example, a black oxide, a metal or other suitable material for blocking infrared light) on the top surface of the silicon cap 324 to block light intrusion into the silicon cap 324. The layer 352 may be molded to the top surface or deposited using a conformal deposition or plating process. The patterning of the opaque material layer 352 (performed using the molding operation or a lithography operation) defines optical apertures 354 aligned with the vertically aligned with the locations of the first photosensitive region 316 for the sensor integrated circuit die 312 and the photoemission region 320 of the emitter integrated circuit die 314.

Figure 3B:
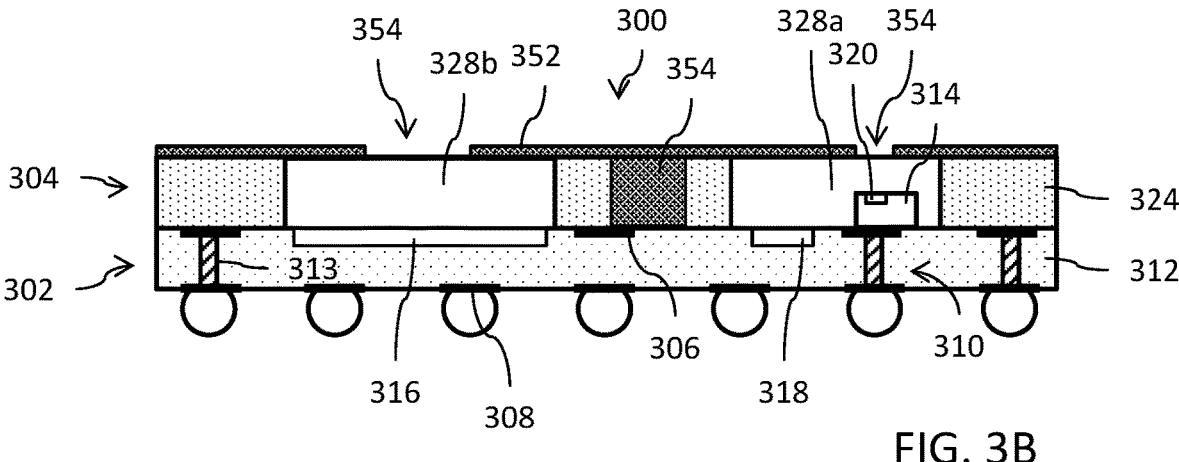

Reference is now made to FIG. 3B which shows a cross-sectional view of a further embodiment of the wafer level ToF proximity micro-sensor module 300. Like references in FIGS. 3A and 3B refer to same parts. The embodiment in FIG. 3B differs from the embodiment in FIG. 3A in that the light cross-talk blocking function within the silicon cap 324 is provided in FIG. 3B by an opaque material block 354 (for example, a black oxide, a metal or other suitable material for blocking infrared light) positioned between the openings filled with the transparent optical elements 328a, 328b. The block 354 may be formed by filling a channel or opening in the silicon cap 324 with an opaque material. Again, this can be achieved by molding within openings or deposition using a conformal deposition or plating process.

Figure 3C:
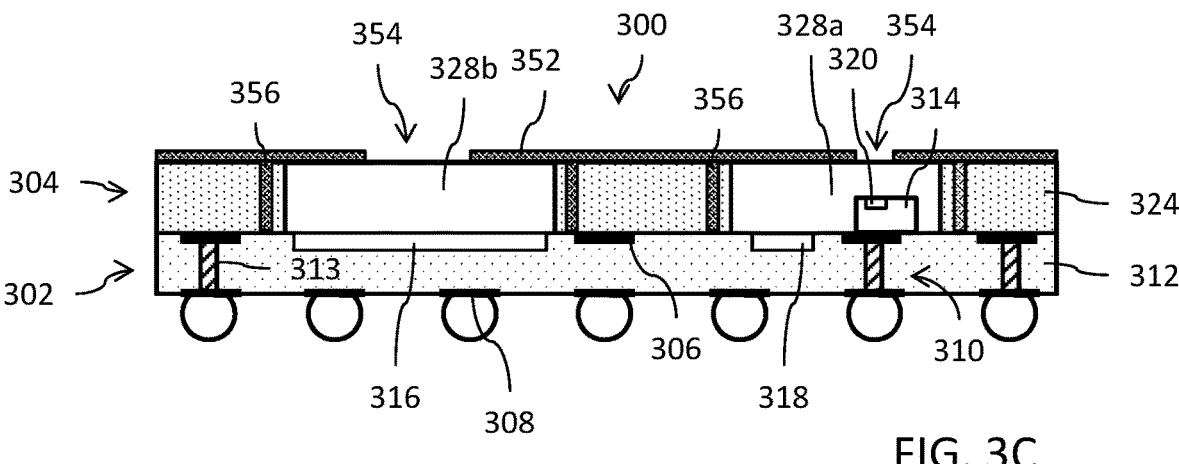

Reference is now made to FIG. 3C which shows a cross-sectional view of another embodiment of the wafer level ToF proximity micro-sensor module 300. Like references in FIGS. 3A, 3B and 3C refer to same parts. The embodiment in FIG. 3C differs from the embodiments in FIGS. 3A and 3B in that the light cross-talk blocking function within the silicon cap 324 is provided in FIG. 3C by an opaque material ring 356 (for example, a black oxide, a metal or other suitable material for blocking infrared light) surrounding each of the openings filled with the transparent optical elements 328a, 328b. The ring 356 may be formed by filling an annular channel or opening in the silicon cap 324 with an opaque material. Again, this can be achieved by molding within openings or deposition using a conformal deposition or plating process.

In operation, light is emitted from the photoemission region 320 of the emitter integrated circuit die 314. A portion of this light is internally reflected within the transparent optical element 328a and detected by the second photosensitive region 318. It will be noted that the light barrier formed by the opaque material layer 350, opaque material block 354 or opaque material ring 356 blocks propagation of the emitted light through the silicon cap 324 towards the first photosensitive region 316. A further portion of the light propagates through the transparent optical element 328a to outside of the micro-sensor module 300 to illuminate a target object. Light reflected by the target object returns to the micro-sensor module 300, passes through the transparent optical element 328b, and is detected by the first photosensitive region 316. It will be noted that the light barrier formed by the opaque material layer 350, opaque material block 354 or opaque material ring 356 blocks propagation of the returned reflected emitted light through the silicon cap 324 towards the second photosensitive region 318. The sensor integrated circuit die 312 measures the difference in time between sensing of the internally refracted light by second photosensitive region 318 and the sensing by the first photosensitive region 316 of the returned light reflected by the target object, and then calculates the distance from micro-sensor module 300 to the target object as a function of the measured difference in time.

Reference is now made to FIGS. 4A-4K which show steps of a method of manufacturing the micro-sensor module 300 of FIG. 3A. These processing steps may further be used, with modification as described herein and shown in FIGS. 5 and 6, in connection with manufacturing the micro-sensor module 300 of FIGS. 3B and 3C.

Figures 4A, 4B, 4C:
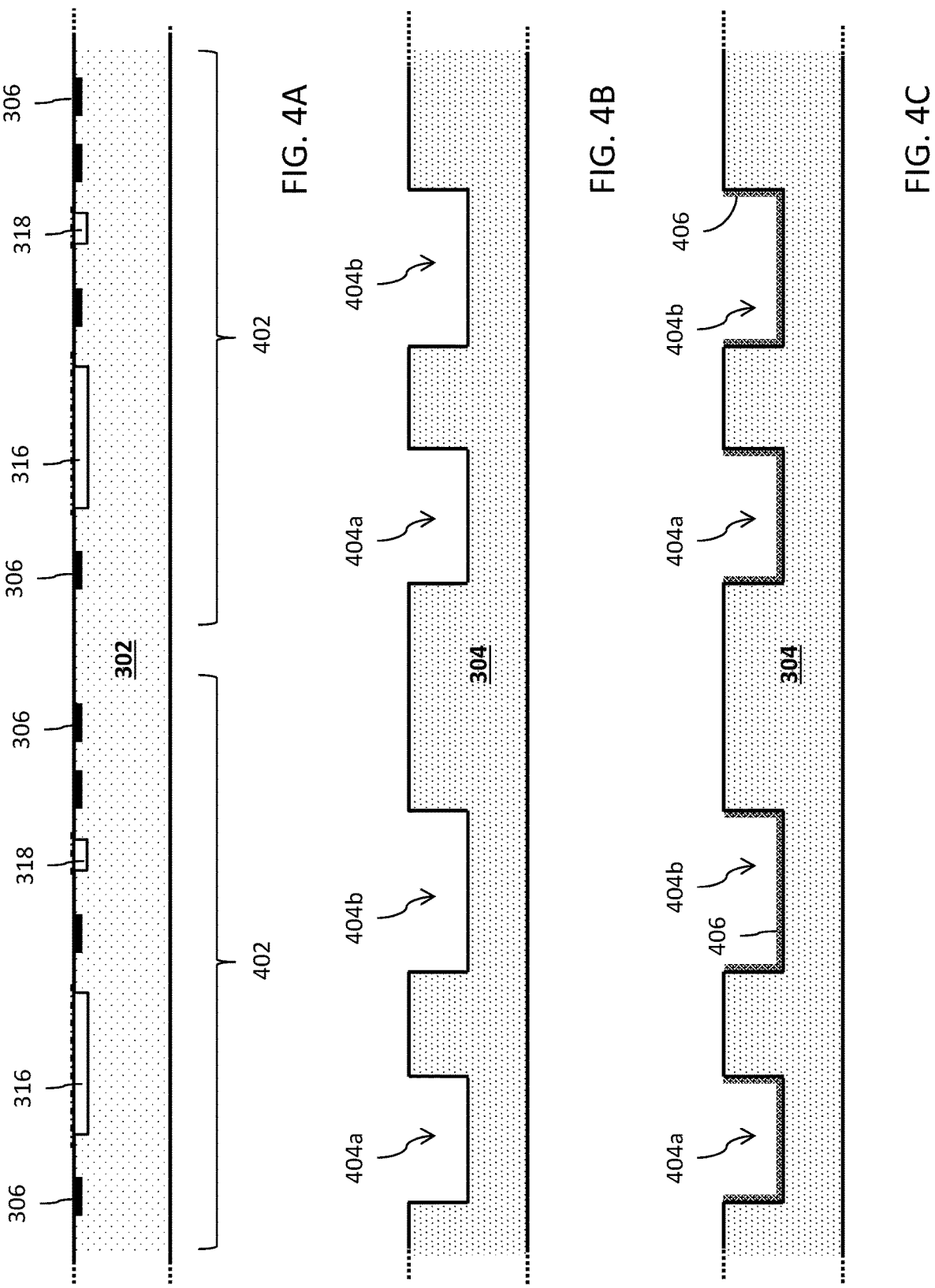
FIGS. 4A-4K shows steps of a method for manufacturing the wafer level ToF proximity micro-sensor module of FIG. 3A.

FIG. 4A—a silicon integrated circuit substrate wafer 302 is fabricated using conventional techniques well known to those skilled in the art. The thickness of the wafer 302 may, for example, be in a range of 50-100 μm. The wafer includes a plurality of integrated circuit areas 402 which are each fabricated to include front connection pads 306, a first photosensitive region 316 and a second photosensitive region 318. Sufficient vacant space is provided between adjacent integrated circuit areas 402 to permit singulation. Although the photosensitive regions 316, 318 and the front connection pads 306 are illustrated as being located at the upper surface of the silicon integrated circuit substrate wafer 302, it will be understood that this is by way of a simplified illustration, it being understood by those skilled in the art that the photosensors for the photosensitive regions 316, 318 are typically located at or within the semiconductor material of the wafer 302 and the front connection pads 306 are typically located in the metallization interconnect levels, which extend over the semiconductor material, of the wafer 302. The photosensitive regions 316, 318 may, for example, be formed by an array of photosensors (such as photodiodes or single photon avalanche diodes (SPADs)).

FIG. 4B—using conventional photolithographic processing techniques, an array of trenches 404a, 404b are etched in a silicon cap wafer 304. The wafer 304 may, for example, have a thickness in a range of 200-300 μm. A chemical etching process may be used to open trenches 404 to a suitable depth. In a referred implementation, the trenches 404 have suitably sized rectangular or square profiles. The profiles may include, for example, rounded corners. The depth of the etched openings for trenches 404a, 404b is controlled to be less than the wafer 304 thickness. The size of the etched opening for trench 404a is controlled to exceed an area occupied by the second photosensitive region 318, certain ones of the front connection pads 306 and a space to be occupied by the emitter integrated circuit die 314 mounted to those certain ones of the front connection pads. The size of the etched opening for trench 404b is controlled to exceed an area occupied by the first photosensitive region 316. Sufficient space is provided between certain adjacent trenches 404 to permit singulation.

FIG. 4C—a layer 406 of opaque material is deposited on the sidewalls and bottoms of the trenches 404a, 404b. The material may, for example, comprise a black oxide, a metal or other suitable material for blocking infrared light. The layer 406 may be formed, for example, using a molding process or a conformal deposition or a plating process. A planarization process may be used to remove portions of the layer 406 on the top surface of the wafer 304. As discussed below, the process step shown in FIG. 5 or 6 could instead be used at this point of the method of manufacturing.

Figures 4D, 4E:
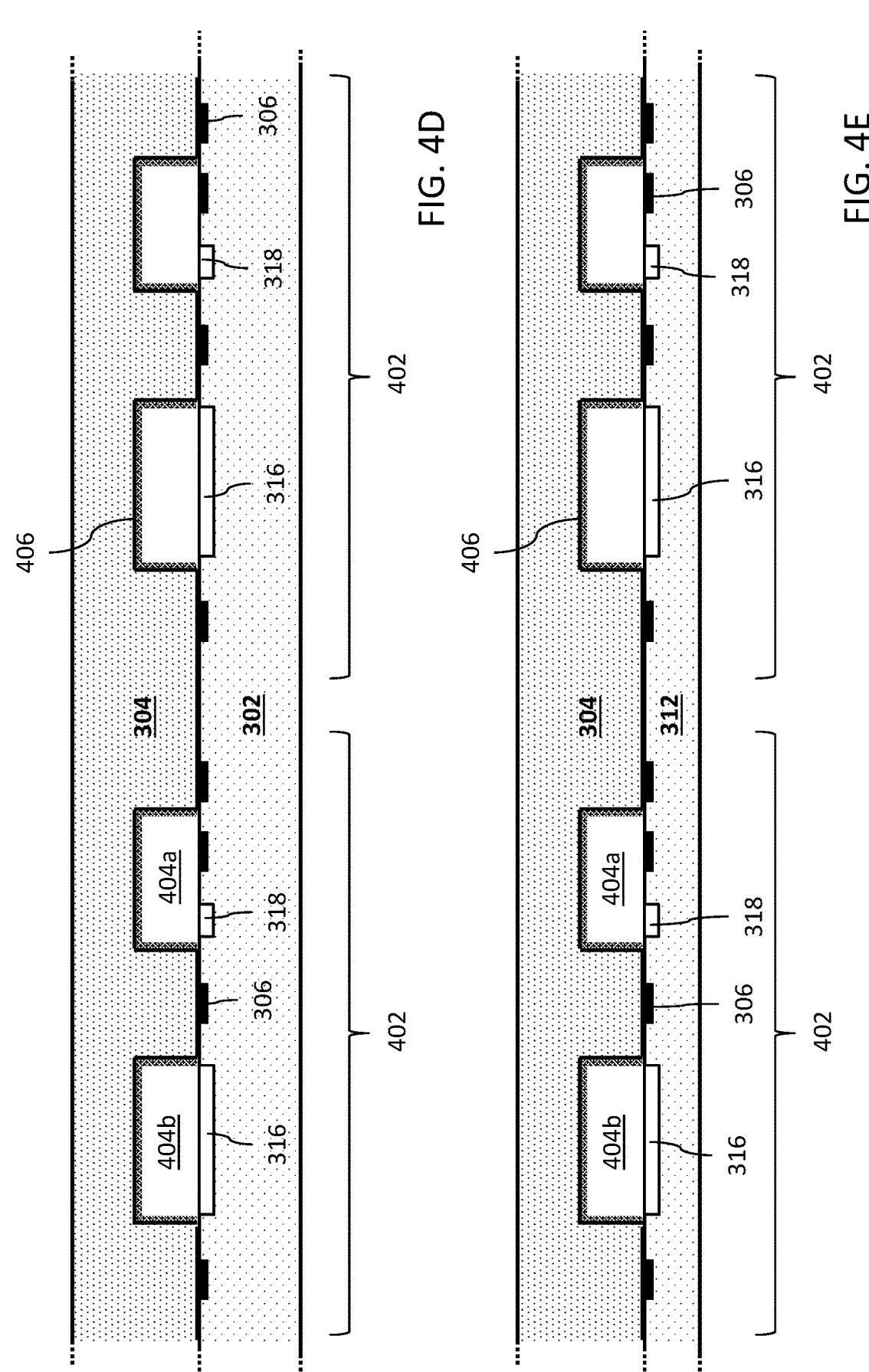

FIG. 4D—the silicon cap wafer 304 is then flipped over and mounted to the upper surface of the silicon integrated circuit substrate wafer 302. Wafer-to-wafer bonding may be used to effectuate this mounting to form a bonded wafer sandwich. The bonding may, for example, utilize an adhesive (for example, epoxy) material. Alternatively, a molecular bonding process may be used. When mounting the silicon cap wafer 304 to the silicon integrated circuit substrate wafer 302, care is taken to align the opening for each trench 404a to the area of the silicon integrated circuit substrate wafer 302 where the second photosensitive region 318, certain ones of the front connection pads 306 and the space to be occupied by the emitter integrated circuit die 314 mounted to those certain ones of the front connection pads are located. Furthermore, when mounting the silicon cap wafer 304 to the silicon integrated circuit substrate wafer 302, care is taken to align the opening for each trench 404b to the area of the silicon integrated circuit substrate wafer 302 where the first photosensitive region 316 is located.

FIG. 4E—a back grinding process is then applied to thin the silicon integrated circuit substrate wafer 302 of the bonded wafer sandwich to define the thickness for the sensor integrated circuit die 312. The thinned thickness of wafer 302 is selected to suit subsequent processing operations (see, the step of FIG. 4F, for example) and is less than original wafer thickness. It will be noted that the full thickness of the silicon cap wafer 304 is present at this point of the manufacturing process to provide rigidity to the bonded wafer sandwich during the back grind performed on the silicon integrated circuit substrate wafer 302.

Figures 4F, 4G:
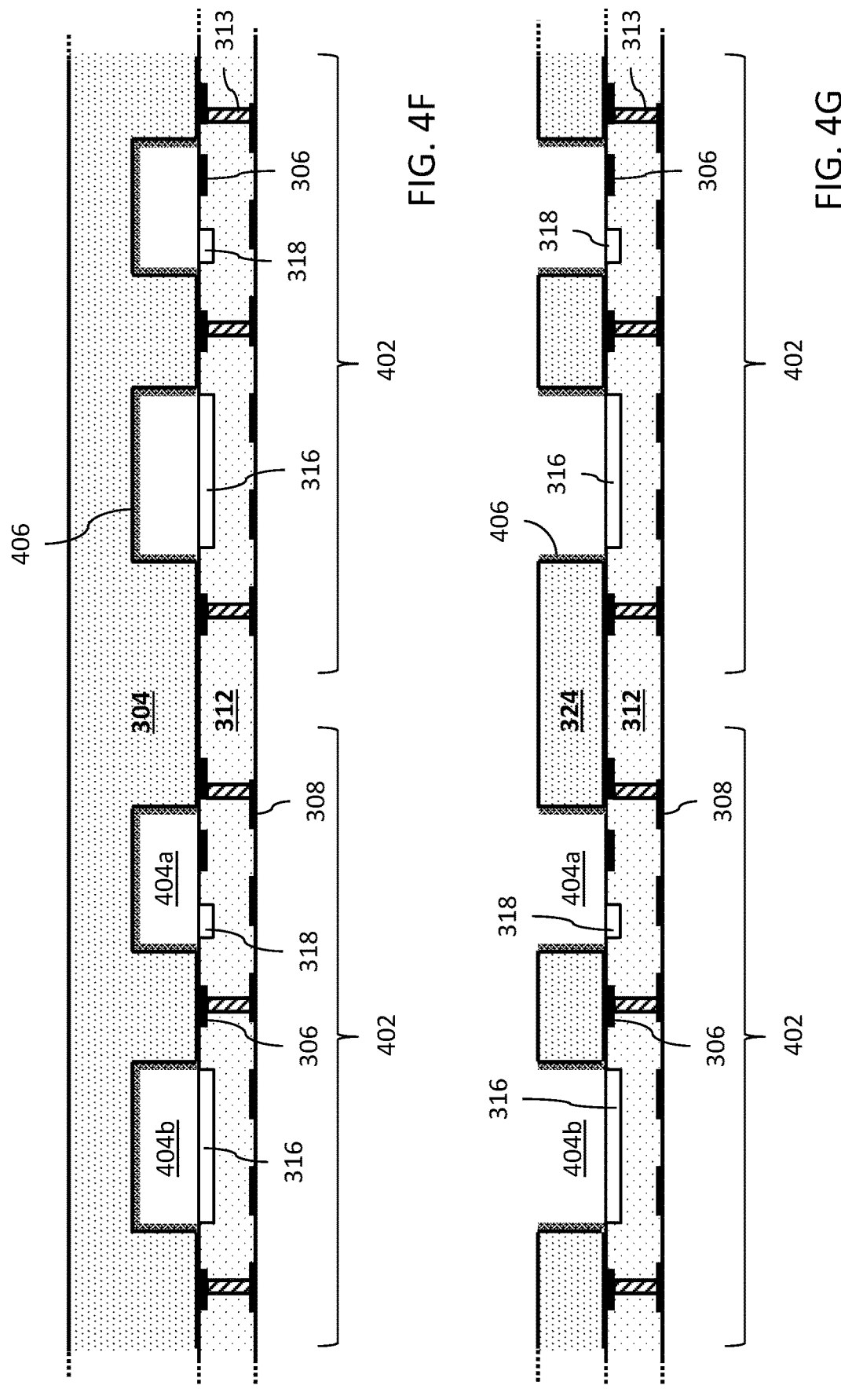

FIG. 4F—through-silicon vias 313 and the rear connection pads 308 of the electrical connection network 310 are then formed in the thinned silicon integrated circuit substrate wafer 302 of the bonded wafer sandwich. The electrical connection network 310 may also include a redistribution layer on the back surface of the thinned silicon integrated circuit substrate wafer 302. The through-silicon vias 313 extend completely through the thinned thickness of the silicon integrated circuit substrate wafer 302 from the rear connection pads 308 to the front connection pads 306. The through-silicon vias 313 may be formed using any suitable through-silicon via fabrication process as is known to those skilled in the art. It will be noted that the full thickness of the silicon cap wafer 304 remain present at this point of the manufacturing process to provide rigidity to the bonded wafer sandwich during the through-silicon via fabrication process.

The presence of the full thickness of the silicon cap wafer 304 during the manufacturing steps of FIGS. 4E and 4F is important since it minimizes the risk of damaging the silicon integrated circuit substrate wafer 302 of the bonded wafer sandwich.

FIG. 4G—a back grinding process is then applied to thin the silicon cap wafer 304 of the bonded wafer sandwich to define the thickness of the silicon cap 324 and expose the openings for trenches 404a, 404b. The thinned thickness of wafer 304 is selected to suit subsequent processing operations and is less than original wafer thickness. For the case of the implementations shown in FIGS. 5 and 6, this back grind on the silicon cap wafer 304 of the bonded wafer sandwich would further reach the opaque material filled trenches 430, 432 providing the block 354 and rings 356, respectively.

It will be noted that a protective material layer (schematically shown by a dot-dash line) may be deposited to cover and protect each of the photosensitive regions 316, 318 in conjunction with the substrate wafer 302 fabrication in the manufacturing step shown in FIG. 4A. This protective material layer serves to protect the regions 316, 318 damage or contamination as a result of performing the back grind of the manufacturing step shown in FIG. 4G. At any suitable point following the FIG. 4G back grind and before the subsequent filling of the openings for trenches 430, 432 in the manufacturing step of FIG. 4I below, this protective material layer may be removed through a selective etch or clean process. The protective material layer may, for example, comprise a water soluble layer that is easily removed. Alternatively, a layer of organic material may be used.

Figures 4H, 4I:
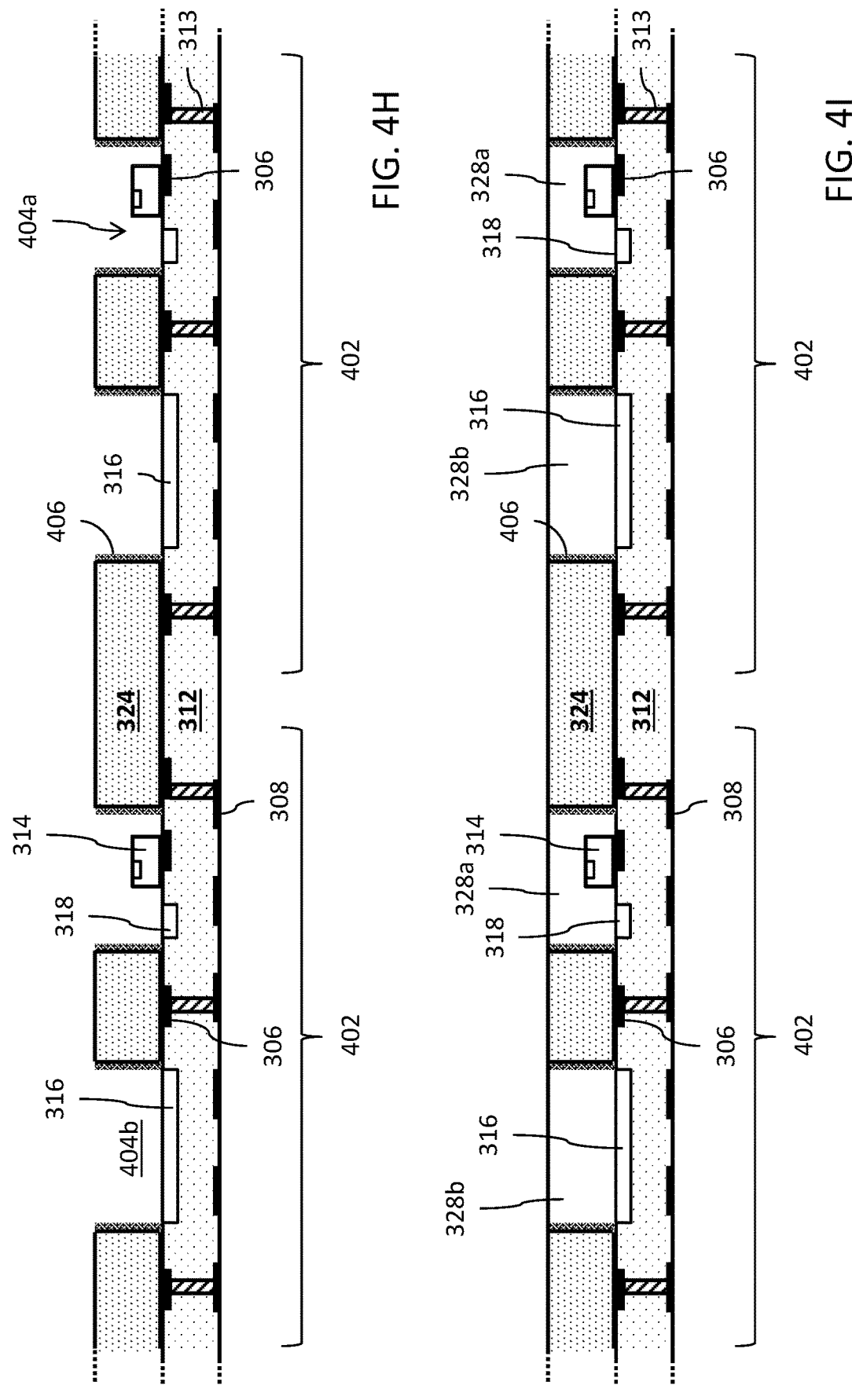

FIG. 4H—emitter integrated circuit dies 314 are then mounted to the upper surface of the silicon integrated circuit substrate wafer 302 in the exposed openings for the trenches 404a and electrically connected to the front connection pads 306. The emitter integrated circuit dies 314 may, for example, comprise semiconductor-based vertical cavity surface-emitting laser (VCSEL) diodes. Although not specifically illustrated, the electrical connection my be made using soldering and/or wire bonding to the front connection pads 306.

FIG. 4I—the exposed openings for the trenches 404a and 404b are then filled with a transparent material (such as a transparent epoxy) to form the transparent optical elements 328. After filling, a planarization process may be performed to remove excess transparent material located on the top surface of the thinned silicon cap wafer 304.

Figures 4J, 4K:
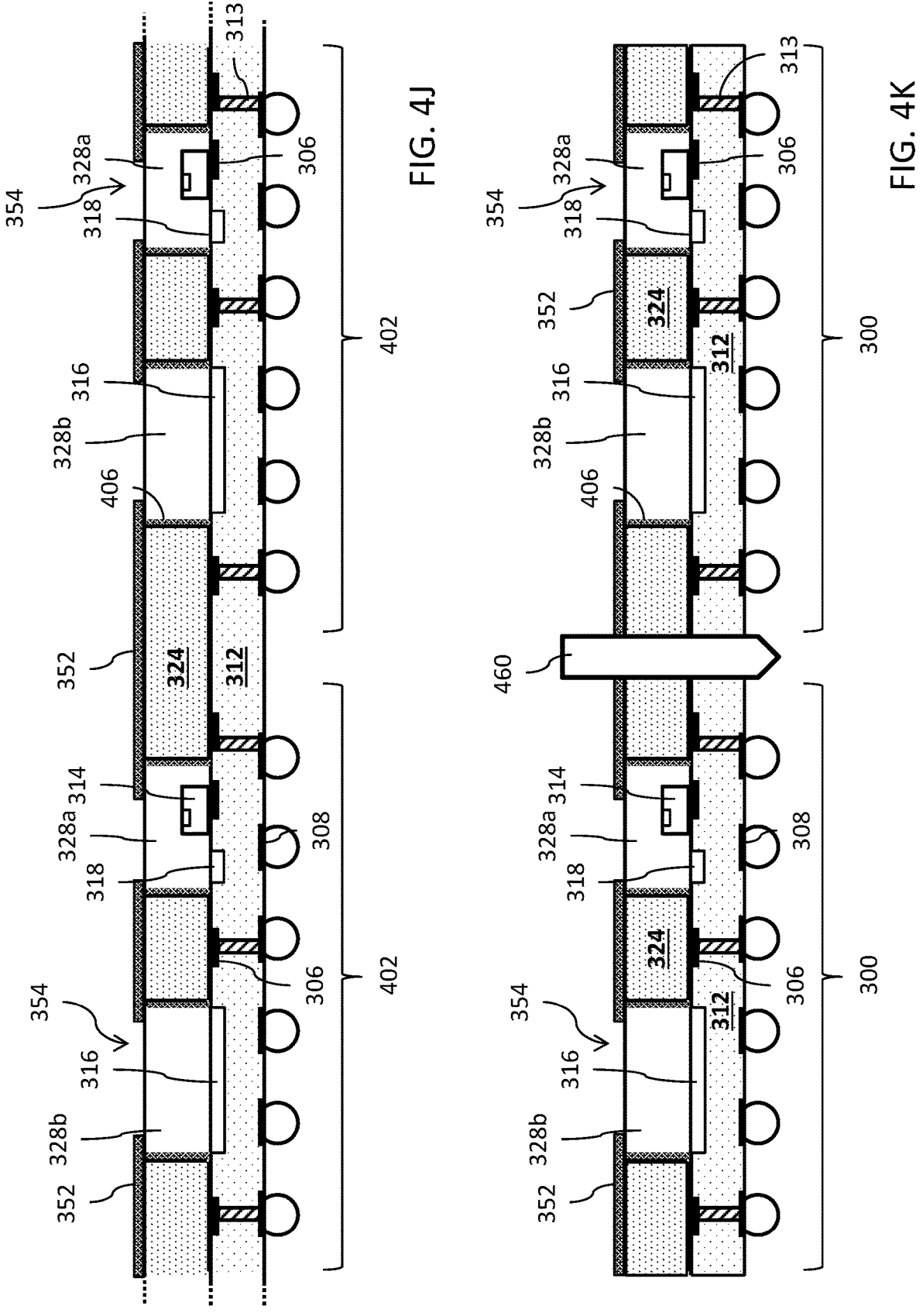

FIG. 4J—a patterned layer 352 of opaque material is then deposited on the top surface of the silicon cap 324 and partially covering the transparent optical elements 328. This layer 352 may, for example, comprise a black oxide, a metal or other suitable material for blocking infrared light. The layer 352 may be formed by molding or deposition. The patterning of the opaque material layer 352 (through the molding process or a lithographic process) defines optical apertures 354 aligned with the vertically aligned with the locations of the first photosensitive region 316 for the sensor integrated circuit die 312 and the photoemission region 320 of the emitter integrated circuit die 314. Additionally, solder balls are attached to the rear connection pads 308. The solder balls may be arranged, for example, in ball grid array pattern FIG. 4K—a singulation, or dicing, process 460 is then performed on the thinned bonded wafer sandwich to cut through the stacked and thinned wafers between the integrated circuit areas 402 and produce individual wafer level proximity micro-sensor modules 300. It will be noted that attachment of solder balls may instead be performed after singulation.

Additionally, an optical filter layer and/or optical lens may be mounted to extend over each optical aperture 354.

Reference is now made to FIG. 5 which shows a process step as a replacement for the process step of FIG. 4C in connection with manufacturing the micro-sensor module 300 shown in FIG. 3B. Here, instead of using the opaque layer 406 lining the openings for the trenches 404a and 404b, a trench 430 is formed in the upper surface of the silicon cap wafer 304 between the openings for the trenches 404a and 404b, and this trench 430 is filled with an opaque material to form the block 354. The opaque material may, for example, comprise for example, a black oxide, a metal or other suitable material for blocking infrared light. Preferably, the opaque material is provided using a molding process. A trench etch and fill process could instead be used.

Reference is now made to FIG. 6 which shows a process step as a replacement for the process step of FIG. 4C in connection with manufacturing the micro-sensor module 300 shown in FIG. 3C. Here, instead of using the opaque layer 406 lining the openings for the trenches 404a and 404b, trenches 432a, 432b are formed in the upper surface of the silicon cap wafer 304 annularly surrounding the openings for the trenches 404a and 404b, respectively. These trenches 432a, 432b are filled with an opaque material to form the rings 356. The opaque material may, for example, comprise for example, a black oxide, a metal or other suitable material for blocking infrared light. Preferably, the opaque material is provided using a molding process. A trench etch and fill process could instead be used.

In a preferred implementation, the micro-sensor module 300 is a component of a electronic device such as a smart phone. More specifically, the micro-sensor module 300 may, for example, be integrated into or with a touch screen of the electronic device.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:
at each integrated circuit area of a plurality of integrated circuit areas for a silicon integrated circuit substrate wafer, forming at least one photosensitive region and at least one front connection pad;
forming a plurality of first trenches and a plurality of second trenches in a silicon cap wafer;
providing an opaque light barrier at the silicon cap wafer to block light transmission through the silicon cap wafer between the first and second trenches;

wafer-to-wafer bonding of the silicon cap wafer to the silicon integrated circuit substrate wafer to form a bonded wafer sandwich, where an opening of each first trench in the silicon cap wafer faces a corresponding photosensitive region of the silicon integrated circuit substrate wafer and wherein an opening of each second trench in the silicon cap wafer faces a corresponding front connection pad of the silicon integrated circuit substrate wafer;
then, performing a back grind to thin the silicon integrated circuit substrate wafer of the bonded wafer sandwich;
forming through silicon vias in the thinned silicon integrated circuit substrate wafer, wherein at least some of the through silicon vias are electrically connected to said at least one photosensitive region in each of the plurality of integrated circuit areas;
then, performing a back grind to thin the silicon cap wafer and expose the openings of the first and second trenches;
installing a light emitter integrated circuit die in the opening for each second trench, the light emitter integrated circuit die mounted to the thinned silicon integrated circuit substrate wafer and electrically connected to said at least one front connection pad;
filling the openings of the first and second trenches with a transparent material; and
cutting through the bonded wafer sandwich between adjacent integrated circuit areas in a singulation operation to produce a plurality of individual wafer level micro-sensor modules.

2. The method of claim 1, wherein providing the opaque light barrier comprises lining sidewalls and a bottom of each first trench and each second trench with an opaque material layer.

3. The method of claim 1, wherein providing the opaque light barrier comprises forming a trench in an upper surface of the silicon cap wafer between the first and second trenches, and filling the trench with an opaque material to form an opaque material block between the first and second trenches.

4. The method of claim 1, wherein providing the opaque light barrier comprises forming an annular trench in an upper surface of the silicon cap wafer around each of the first and second trenches, and filling each annular trench with an opaque material to form an opaque material ring around each of the first and second trenches.

5. A method, comprising:
at each integrated circuit area of a plurality of integrated circuit areas for a silicon integrated circuit substrate wafer, forming at least one photosensitive region and at least one front connection pad;
covering each photosensitive region with a protective layer before wafer-to-wafer bonding;
forming a plurality of first trenches and a plurality of second trenches in a silicon cap wafer;
providing an opaque light barrier at the silicon cap wafer to block light transmission through the silicon cap wafer between the first and second trenches;
wafer-to-wafer bonding of the silicon cap wafer to the silicon integrated circuit substrate wafer to form a bonded wafer sandwich, where an opening of each first trench in the silicon cap wafer faces a corresponding photosensitive region of the silicon integrated circuit substrate wafer and wherein an opening of each second trench in the silicon cap wafer faces a corresponding front connection pad of the silicon integrated circuit substrate wafer;

then, performing a back grind to thin the silicon integrated circuit substrate wafer of the bonded wafer sandwich;

then, performing a back grind to thin the silicon integrated circuit substrate wafer of the bonded wafer sandwich;

forming through silicon vias in the thinned silicon integrated circuit substrate wafer, wherein at least some of the through silicon vias are electrically connected to said at least one photosensitive region in each of the plurality of integrated circuit areas;

then, performing a back grind to thin the silicon cap wafer and expose the openings of the first and second trenches;

removing the protective layer after performing the back grind to thin the silicon cap wafer;

installing a light emitter integrated circuit die in the opening for each second trench, the light emitter integrated circuit die mounted to the thinned silicon integrated circuit substrate wafer and electrically connected to said at least one front connection pad;

filling the openings of the first and second trenches with a transparent material; and cutting through the bonded wafer sandwich between adjacent integrated circuit areas in a singulation operation to produce a plurality of individual wafer level micro-sensor modules.

6. The method of claim 5, wherein providing the opaque light barrier comprises lining sidewalls and a bottom of each first trench and each second trench with an opaque material layer.

7. The method of claim 5, wherein providing the opaque light barrier comprises forming a trench in an upper surface of the silicon cap wafer between the first and second trenches, and filling the trench with an opaque material to form an opaque material block between the first and second trenches.

8. The method of claim 5, wherein providing the opaque light barrier comprises forming an annular trench in an upper surface of the silicon cap wafer around each of the first and second trenches, and filling each annular trench with an opaque material to form an opaque material ring around each of the first and second trenches.

9. A method, comprising:

at each integrated circuit area of a plurality of integrated circuit areas for a silicon integrated circuit substrate wafer, forming at least one photosensitive region and at least one front connection pad;

forming a plurality of first trenches and a plurality of second trenches in a silicon cap wafer;

providing an opaque light barrier at the silicon cap wafer to block light transmission through the silicon cap wafer between the first and second trenches;

wafer-to-wafer bonding of the silicon cap wafer to the silicon integrated circuit substrate wafer to form a bonded wafer sandwich, where an opening of each first trench in the silicon cap wafer faces a corresponding photosensitive region of the silicon integrated circuit substrate wafer and wherein an opening of each second trench in the silicon cap wafer faces a corresponding front connection pad of the silicon integrated circuit substrate wafer;

then, performing a back grind to thin the silicon integrated circuit substrate wafer of the bonded wafer sandwich;

forming through silicon vias in the thinned silicon integrated circuit substrate wafer, wherein at least some of the through silicon vias are electrically connected to said at least one photosensitive region in each of the plurality of integrated circuit areas;

then, performing a back grind to thin the silicon cap wafer and expose the openings of the first and second trenches;

installing a light emitter integrated circuit die in the opening for each second trench, the light emitter integrated circuit die mounted to the thinned silicon integrated circuit substrate wafer and electrically connected to said at least one front connection pad;

filling the openings of the first and second trenches with a transparent material;

after filling the openings of the first and second trenches with the transparent material, covering an upper surface of the thinned silicon cap wafer with a patterned layer of opaque material that includes apertures over each of the transparent material filled openings of the first and second trenches; and cutting through the bonded wafer sandwich between adjacent integrated circuit areas in a singulation operation to produce a plurality of individual wafer level micro-sensor modules.

10. The method of claim 9, wherein providing the opaque light barrier comprises lining sidewalls and a bottom of each first trench and each second trench with an opaque material layer.

11. The method of claim 9, wherein providing the opaque light barrier comprises forming a trench in an upper surface of the silicon cap wafer between the first and second trenches, and filling the trench with an opaque material to form an opaque material block between the first and second trenches.

12. The method of claim 9, wherein providing the opaque light barrier comprises forming an annular trench in an upper surface of the silicon cap wafer around each of the first and second trenches, and filling each annular trench with an opaque material to form an opaque material ring around each of the first and second trenches.

* * * * *